United States Patent
Bollman et al.

(10) Patent No.: US 10,901,013 B2
(45) Date of Patent: Jan. 26, 2021

(54) APPARATUS AND METHOD FOR DETECTING THE ABSENCE OF VOLTAGE

(71) Applicant: Rolls-Royce North American Technologies Inc., Indianapolis, IN (US)

(72) Inventors: Andrew Bollman, Plainfield, IN (US); Sean Guitar, Indianapolis, IN (US)

(73) Assignee: Rolls-Royce North American Technologies, Inc., Indianapolis, IN (US)

( * ) Notice: Subject to any disclaimer, the term of this patent is extended or adjusted under 35 U.S.C. 154(b) by 209 days.

(21) Appl. No.: 16/017,818

(22) Filed: Jun. 25, 2018

(65) Prior Publication Data

US 2019/0391186 A1    Dec. 26, 2019

(51) Int. Cl.
*G01R 19/155*    (2006.01)
*G01R 15/14*    (2006.01)

(52) U.S. Cl.
CPC ......... *G01R 19/155* (2013.01); *G01R 15/144* (2013.01)

(58) Field of Classification Search
None
See application file for complete search history.

(56) References Cited

U.S. PATENT DOCUMENTS

| | | | |
|---|---|---|---|
| 2,246,173 A * | 6/1941 | Herskind | H02M 7/153 363/94 |
| 5,886,422 A * | 3/1999 | Mills | H02P 5/60 307/29 |
| 8,013,613 B2 | 9/2011 | Allen, Jr. | |
| 8,964,339 B2 | 2/2015 | Li et al. | |
| 2005/0237048 A1* | 10/2005 | Weems, II | G01R 35/00 324/115 |
| 2010/0033190 A1 | 2/2010 | Devine | |
| 2014/0035366 A1* | 2/2014 | Ganor | H02J 1/00 307/18 |
| 2015/0015234 A1* | 1/2015 | Ayanegui | G01R 19/155 324/76.11 |

(Continued)

OTHER PUBLICATIONS

Pandijit, "VeriSafe Absence of Voltage Tester, The Safe Way to Verify the Absence of Voltage," 2016, 8pgs. http://www.panduit.com/ccurl/399/131/abense-of-voltage-detector-sfcb06,0.pdf.

(Continued)

*Primary Examiner* — Paresh Patel
(74) *Attorney, Agent, or Firm* — Shumaker & Sieffert, P.A.

(57) ABSTRACT

Electrical voltage detection circuit and methods for determining the presence or absence of voltage in electrical equipment. An isolated power supply provides power to one or more voltage detection devices configured to detect voltage on one or more busses of electrical equipment. A switch is configured to provide supply voltage from the isolated power supply to the one or more busses of electrical equipment when the switch is closed. The voltage detection devices may determine if the one or more busses of electrical equipment are de-energized by detecting the voltage on the busses when the switch is open. The integrity of the electrical equipment may be verified by detecting, with the voltage detection devices, the voltage on the busses when the switch is closed, where the expected voltage readings are based on voltages being provided to one or more busses by the isolated power supply.

18 Claims, 5 Drawing Sheets

(56) References Cited

U.S. PATENT DOCUMENTS

2016/0094141 A1* 3/2016 Petkov .................. H02M 5/293
                                                        323/205
2017/0269128 A1   9/2017 Bugaris et al.
2017/0269129 A1   9/2017 Bolouri-Saransar et al.

OTHER PUBLICATIONS

Bugaris, R., "Absence of Voltage Testers: A Guide to Listing Requirements," IEEE 2017 Annual Pulp, Paper and Forest Industries Technical Conference, Jun. 18-23, 2017, 8pgs. https://ieeexplore.ieee.org/document/8003857/.
Extended European Search Report from counterpart European Application No. 19179317.3, dated Jan. 17, 2020, 6 pgs.
Bugaris, "Improving Electrical Safety in the Workplace", IEEE Industry Applications Magazine, Feb. 27, 2017, 12 pgs.
Response to Extended European Search Report from counterpart European Application No. 19179317.3, dated Jan. 17, 2020, filed Jun. 23, 2020, 57 pgs.
Communication under Rule 71(3) EPC from counterpart EP Application No. 19179317.3 dated Sep. 21, 2020, 66 pgs.

* cited by examiner

APPARATUS AND METHOD FOR DETECTING THE ABSENCE OF VOLTAGE

FIELD OF THE DISCLOSURE

The present disclosure relates generally to electrical systems and, more specifically, to electrical voltage detection systems.

BACKGROUND

Prior to operating or servicing electrical equipment, operators often times must verify that the electrical equipment is not under an electrically hazardous condition. For example, operators of such electrical equipment may be required to follow electrical safety standards when working on or operating on the electrical equipment. To verify whether electrical equipment is safe, operators must test the electrical equipment to assure the electrical equipment is in an electrically safe condition. Until the electrical equipment is deemed electrically safe, the electrical equipment should be considered electrically unsafe and capable of causing harm to the operator.

One such verification test checks for absence of voltage on electrical equipment, known as a live-dead-live test. To perform the test, an operator would first use a voltmeter (e.g., voltage tester, voltage meter) to measure voltage on a known, energized source. If the voltmeter measures a correct voltage for the known, energized source, the test confirms that the voltmeter itself is operational. The operator then would, using the same voltmeter, measure the electrical equipment for voltage to determine whether the voltmeter indicates that the electrical equipment is under a hazardous voltage. Whether the voltmeter indicates that the electrical equipment is or is not under a hazardous voltage, the operator is to assume that the electrical equipment is not electrically safe until the final step of the test is performed.

For the final step of the test, the operator once again tests the voltmeter on a known, energized source. This step assures that the voltmeter itself did not fail between the time when it was first tested on a known, energized source, and when the electrical equipment was tested. The electrical equipment is deemed electrically safe only if the voltmeter measured a correct voltage when tested on a known, energized source both before, and after, having tested the electrical equipment for a voltage that is electrically safe. Otherwise, the electrical equipment is to be considered electrically unsafe.

Unless the electrical equipment has been verified as electrically safe (or absent of dangerous voltage), operators (technicians) working on the equipment must assume the electrical equipment is not in an electrically safe condition and must take precautions to avoid possible electrical shock. One such precaution an operator may take includes wearing protective equipment (PPE). PPE, however, may be heavy, burdensome, and costly as well. In addition, operators spend time dressing in PPE—time which may be spent on operating or servicing the electrical equipment instead. In addition, often times the electrical equipment is outdoors. Environmental factors, such as snow, ice, or heat may make it even more uncomfortable and/or challenging to test the electrical equipment. As such, there are opportunities to address the testing of electrical equipment for electrically unsafe conditions.

SUMMARY

In accordance with some embodiments of the present disclosure, a high voltage power rail with an integral voltage hazard safety circuit includes an electric rail comprising a first node and a second node, where the electric rail is electrically connected to a high voltage operational power supply. An electrically driven device is connected to the high voltage operational power supply via the electric rail. The integral voltage hazard safety circuit further includes a voltage meter having a first probe attached to the first node of the electric rail and a second probe attached to the second node of the electric rail.

The integral voltage hazard safety circuit may also include a secondary power supply that is configured to provide a known voltage across the first and second nodes of the electric rail, where the second power supply is electrically connected to and powers the voltage meter, and where the high voltage operational power supply and the secondary power supply are independent of each other. In some examples, a voltage of the high voltage operational power supply is greater than a maximum voltage of the secondary power supply.

The integral voltage hazard safety circuit may include a first switch positioned electrically between the electric rail and the high voltage operationally power supply that is operable to electrically connect and disconnect the high voltage operational power supply to the electric rail. The integral voltage hazard safety circuit may also include a second switch positioned electrically between the electric rail and the secondary power supply. For example, the second switch may be a momentary contact switch that is biased open. The second switch is operable to electrically connect and disconnect the secondary power supply to the electric rail. The integral voltage hazard safety circuit may further include a voltage indicator (e.g., a display) operably connected to the voltage meter and configured to provide an indication of a voltage measured by the voltage meter.

In some examples, the integral voltage hazard safety circuit includes a second voltage meter having a first probe attached to a first node of a second electric rail and a second probe attached to a second node of the second electric rail. The voltage indicator may be operably connected to the second voltage meter and be configured to provide an indication of a voltage measured by the second voltage meter.

In some examples, the integral voltage hazard safety circuit includes an isolation circuit that protects the secondary power source from voltage on the electric rail provided by the high voltage operational power supply. The isolation circuit includes a first diode positioned electrically between the first node and the second node that is operable to allow current to flow from the first node to the second node when a first threshold of voltage across the first diode is reached.

In some examples, the isolation circuit includes a second diode positioned electrically between the secondary power supply and the first node. The isolation circuit may also include a resistor positioned electrically between the secondary power supply and the first node, and a fuse positioned electrically between the secondary power supply and the first node.

In some examples, the high voltage power rail with integral voltage hazard safety circuit further includes a removable housing that prevents access to the electric rail while in an installed state. In some examples, the voltage indicator is observable when the removable housing is in the installed state.

In some examples, the high voltage power rail with integral voltage hazard safety circuit further includes a processor that is operably coupled to the voltage meter and configured to determine the voltage measured by the voltage meter. In some examples, the processor is operably coupled to a display and is configured to provide the indication of the voltage measured by the voltage meter to the display. In some examples, the processor is operably coupled to the second switch and is configured to determine whether the second switch is open or closed. The processor may also be configured to determine whether the voltage measured by the voltage meter is within a safe voltage range based on whether the second switch is open or closed. For example, the processor may be configured to determine whether the voltage measured by the voltage meter is within a safe voltage range based on a known voltage provided by the secondary power supply when the second switch is closed.

In some examples, the integral voltage hazard safety circuit includes an isolation circuit comprising a diode positioned electrically between the first node and the second node, and a fuse positioned electrically between the first node and the diode.

In some examples, the integral voltage hazard safety circuit includes a direct current (DC)-to-DC power converter positioned electrically between the second switch and the first node.

In some examples, the integral voltage hazard safety circuit includes a third switch positioned electrically between the secondary power supply and the voltage meter, where the third switch is operable to electrically connect and disconnect the secondary power supply to the voltage meter.

In some embodiments, an electrical system configured to detect voltage of a plurality of busses of an electrical load includes a first power converter, a second power converter, a power supply configured to provide power to the first power converter, and a voltage meter electrically connected to the first power converter and configured to receive output power from the first power converter. The electrical system also includes a first switch electrically connected to a voltage input of the voltage meter that is configured to switch between the plurality of busses of the electrical load. The electrical system also includes a second switch electrically connected to the power supply and configured to provide power from the power supply to the second power converter when the second switch is closed. The electrical system further includes a third switch electrically connected to the second power converter and configured to receive output power from the second power converter when the second switch is closed, where the third switch is configured to switch between the plurality of busses of the electrical load.

In some examples the first switch and the third switch of the electrical system are configured to switch to a same bus of the plurality of busses when the second switch is closed.

In some examples the voltmeter is configured to detect a voltage of at least one of the plurality of busses of the electrical load when the second switch is open. In some examples the voltmeter is configured to detect the output power from the second power converter when the second switch is closed.

In some examples, the first switch and the third switch are configured to select a same bus of the plurality of busses of the electrical load. In some examples, the voltmeter is configured to detect the output power from the second power converter on the selected bus.

In some embodiments, a method of detecting a voltage hazard includes providing, by a secondary power supply, operational power to a voltage meter having a first probe attached to a first node of an electric rail and a second probe attached to a second node of the electric rail. The method further includes detecting, by the voltage meter, a first voltage of the electric rail, and providing, by a voltage indicator operably connected to the voltage meter, an indication of the first voltage. The method may include determining, based on the indication of the first voltage, whether the detected voltage is within a first safe range. The method may further include closing a first switch, and providing, by the secondary power supply, a known voltage across the first and second nodes of the electric rail when the first switch is closed.

The method may further include detecting, by the voltage meter, a second voltage of the electric rail, and providing, by the voltage indicator, an indication of the second voltage. The method may further include determining, based on the indication of the second voltage, whether the second voltage is within a second safe range. The method may further include opening the first switch, and detecting, by the voltage meter, a third voltage of the electric rail when the first switch is opened. The method may also include providing, by the voltage indicator, an indication of the third voltage; and determining, based on the indication of the third voltage, whether the third voltage is within the first safe range.

In some examples, the method includes providing, by the secondary power supply, operational power to a second voltage meter having a first probe attached to a first node of a second electric rail and a second probe attached to a second node of the second electric rail. The method may include detecting, by the second voltage meter, a first voltage of the second electric rail, and providing, by the voltage indicator operably connected to the second voltage meter, an indication of the first voltage of the second electric rail. The method may further include determining, based on the indication of the first voltage of the second electric rail, whether the first voltage of the second electric rail is within a third safe range.

The method may also include providing, by the secondary power supply, a known voltage across the first and second nodes of the second electric rail when the first switch is closed. The method may include detecting, by the second voltage meter, a second voltage of the second electric rail when the first switch is closed, and providing, by the voltage indicator, an indication of the second voltage of the second electric rail. The method may include determining, based on the indication of the second voltage of the second electric rail, whether the second voltage of the second electric rail is within a fourth safe range.

The method may also include detecting, by the second voltage meter, a third voltage of the second electric rail when the first switch is opened, and providing, by the second voltage indicator, an indication of the third voltage of the second electric rail. The method may further include determining, based on the indication of the third voltage of the second electric rail, whether the third voltage is within the third safe range.

In some examples, the method may include providing, by a high voltage operational power supply, a high voltage to an electrically driven device connected to the electric rail, where the secondary power supply is independent of the high voltage operational power supply. The method may also include detecting, by the voltage meter, a hazardous voltage across the first and second nodes of the electric rail based on providing the high voltage to the electrically driven device.

In some embodiments, a method of detecting voltage includes providing, by at least one battery, a supply voltage to a first voltage meter and to a second voltage meter. The method further includes detecting, by the first voltage meter, a first voltage across a first node and a second node, and detecting, by the second voltage meter, a second voltage across the second node and a third node. The method also includes closing an electrical switch electrically connected between a fourth node and the first node, and between the fourth node and the third node, and providing, by the electrical switch, the supply voltage from the at least one battery to the first node and to the second node.

In some examples, the method further includes detecting, by the first voltage meter, a third voltage across the first node and the second node, and detecting, by the second voltage meter, a fourth voltage across the second node and the third node.

In some examples, the method includes opening the electrical switch thereby preventing the supply voltage from the at least one battery to be provided to the first node and to the second node. The method may also include detecting, by the first voltage meter, a fifth voltage across the first node and the second node, and detecting, by the second voltage meter, a sixth voltage across the second node and the third node.

Among other advantages, the apparatus and methods described herein may reduce or eliminate the need for standard live-dead-live checks of electrical equipment, which may require operators to dress in burdensome and costly protective equipment. In addition, testing time of electrical equipment may be reduced, and may prevent operators from having to dress in heavy protective suits in unpleasant environments such as when the electrical equipment is located outdoors in a warm environment.

These and many other advantages of the present subject matter will be readily apparent to one skilled in the art to which the disclosure pertains from a perusal of the claims, the appended drawings, and the following detailed description of preferred embodiments.

Figure 1:
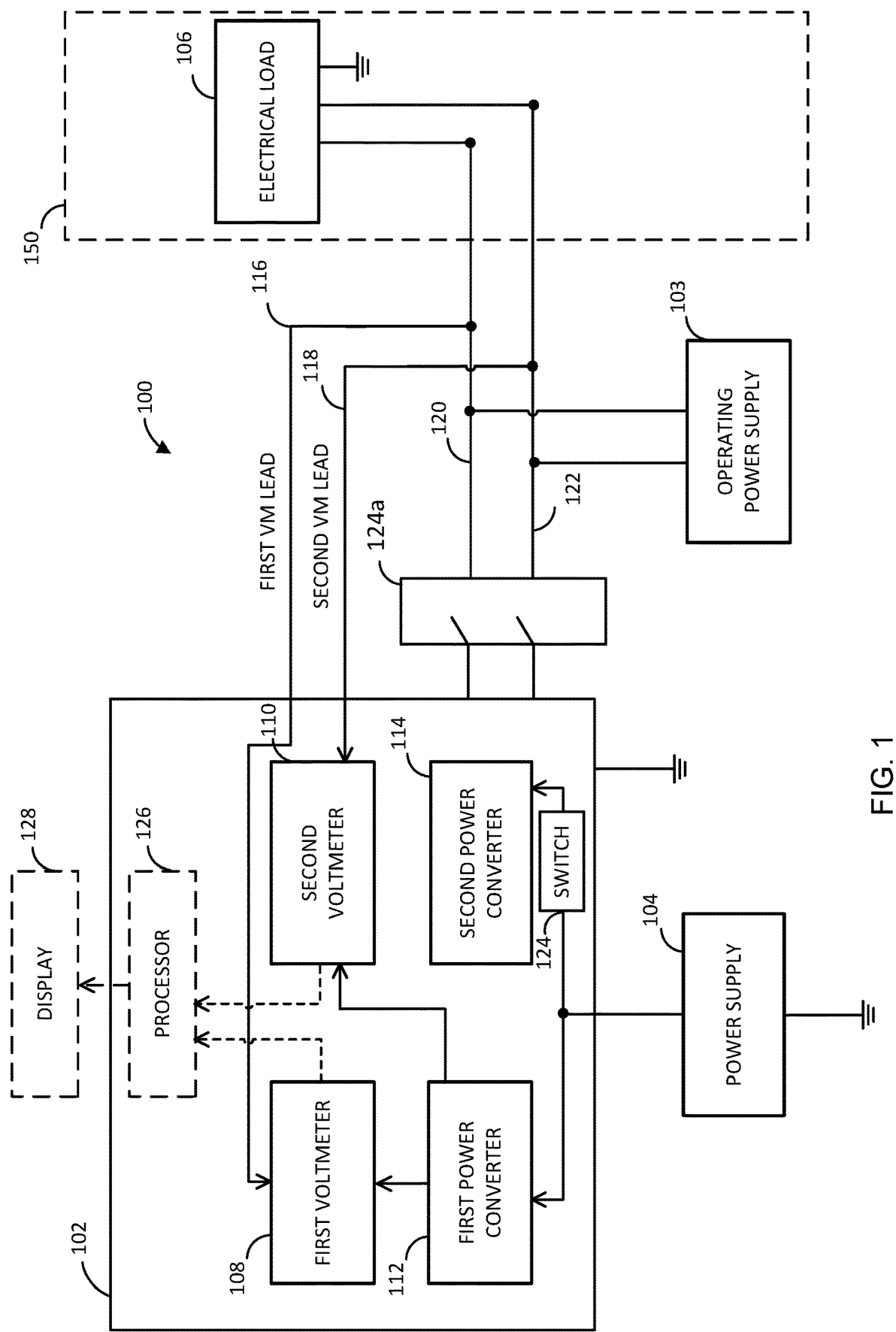
FIG. 1 is a block diagram of an exemplary electrical system that includes a voltage detection circuit with dual voltmeters and an isolated power supply in accordance with some embodiments of the present disclosure.

While the present disclosure is susceptible to various modifications and alternative forms, specific embodiments are shown by way of example in the drawings and will be described in detail herein. The objectives and advantages of the claimed subject matter will become more apparent from the following detailed description of these exemplary embodiments in connection with the accompanying drawings. It should be understood, however, that the present disclosure is not intended to be limited to the particular forms disclosed. Rather, the present disclosure covers all modifications, equivalents, and alternatives that fall within the spirit and scope of these exemplary embodiments.

DETAILED DESCRIPTION

For the purposes of promoting an understanding of the principles of the disclosure, reference will now be made to a number of illustrative embodiments in the drawings and specific language will be used to describe the same.

FIG. 1 illustrates a block diagram of an exemplary electrical system 100 that includes voltage detection circuit 102, power supply 104, operational power supply 103, and electrical load 106. As indicated in the diagram, voltage detection circuit 102 includes a first voltmeter 108 and a second voltmeter 110. Each of first voltmeter 108 and second voltmeter 110 may be, for example, a panel meter, a digital panel meter, or any other suitable device capable of measuring voltage.

Voltage detection circuit 102 may be, for example, employed as a mounted test device on electrical equipment, where the electrical equipment includes electrical load 106. Voltage detection circuit 102 also includes first power converter 112, second power converter 114, and electrical switch 124. Each of first power converter 112 and second power converter 114 may be any suitable power (e.g., voltage) converter, such as a direct current (DC) to DC power converter, or voltage regulator.

Voltage detection circuit 102 is electrically coupled to power supply 104, and may receive power (e.g., voltage) from power supply 104. Power supply 104 may be a battery, or any other suitable power source. In some embodiments, power supply 104 is a 24 Volt (V) nominal battery. As is explained in more detail below, in some examples power supply 104 provides power to first voltmeter 108, second voltmeter 110, and first power converter 112. Depending on the state of electrical switch 124, power supply 104 may also provide power to second power converter 114. For example, if electrical switch 124 is closed, then power from power supply 104 is provide to second power converter 114.

Electrical switch 124 may be, for example, a momentary, normally open, pushbutton electrical switch. In some examples, electrical switch 124 may instead be a mechanical switch. The electrical switch 124 may be located on the exterior of the electrical load 106 being measured. In some examples, the electrical switch 124 is located near the first voltmeter 108 and the second voltmeter 110. As such, an operator has convenient access to view the readings on the first and second voltmeters 108, 110, as well as convenient access to open or close electrical switch 124.

Electrical load 106 may include any electrical equipment driven by the rails, such as, for example, all or part of an aircraft engine, or any other suitable electrical load. First voltmeter 108 and second voltmeter 110 are electrically connected to busses or rails 120, 122. First voltmeter 108 may detect a voltage on bus 120 via first voltmeter connection 116, and second voltmeter 110 may detect a voltage on bus 122 via second voltmeter connection 118. For example, the buses 120, 122 may include a power rail at +350 and a rail at −350 providing 700 V between them. A first voltmeter connection 116 may be electrically connected to a positive rail, and second voltmeter connection 118 may be electrically connected to a negative rail (e.g., a 350 V positive rail, and a negative 350 V (−350 V) rail respectively).

Depending on the current configuration of voltage detection circuit 102, second power converter 114 may provide one or more voltages over bus 120 and bus 122. For example, and as explained in further detail below, in some embodiments second power converter 114 may provide a voltage on bus 120, which may then be detected by first voltmeter 108 via first voltmeter connection 116. Similarly, in some embodiments second power converter 114 may provide a voltage on second bus 122, which may then be detected by second voltmeter 110 via second voltmeter connection 118.

Voltage detection circuit 102 may test whether buses are in an electrically unsafe condition. For example, first voltmeter connection 116 may be electrically connected to a first power rail of bus 120, and second voltmeter connection 118 may be electrically connected to a second power rail of bus 122. As such, an operator of electrical system 100, assuring electrical switch 124 is open, may determine voltages for each of the first and second power rails of by reading voltages indicated by first voltmeter 108 and second voltmeter 110. If each of the detected voltages are within a safe voltage range, the operator may continue with testing. A safe voltage range may include, for example, a voltage indication that the electrical load is de-energized (e.g., 0 Volts). For example, the safe voltage range may include a voltage range of −1 Volt to 1 Volt. Otherwise, if the detected voltages are not within a safe voltage range, the operator must assume the electrical system 100 is in an unsafe condition before troubleshooting electrical system 100.

Assuming the detected voltages are within a safe voltage range, the operator may continue testing electrical system 100 by causing electrical switch 124 to close. For example, the operator may press a momentary pushbutton that closes electrical switch 124. Closing electrical switch 124 causes power from power supply 104 to reach the power rails of buses 120, 122. Specifically, closing electrical switch 124 may allow power from power supply 104 to reach second power converter 114, which may then provide voltages on first bus 120 and second bus 122. Alternatively, a switch 124*a* may be used to connect the second or first power supply to the buses.

Bus 120 and bus 122 may be electrically connected, respectively, to first voltmeter connection 116 and to second voltmeter connection 118. For example, electrical load 106 may internally tie first bus 120 voltage to first connection lead 116. Similarly, electrical load 106 may internally tie second bus 122 to second voltmeter connection 118. Alternatively, first bus 120 and second bus 122 may be electrically connected, respectively, to first voltmeter connection 116 and to second voltmeter connection 118 outside of electrical load 106, such as at a switching station. In some examples, electrical load 106 is within a physical barrier 150, such as an enclosure, where all or a part of physical barrier 150 (e.g., access door) would need to be physically removed to access electrical load 106.

An operator may determine if the voltages provided on first bus 120 and second bus 122 are detected by first voltmeter 108 and second voltmeter 110, respectively, by reading their indicated voltages. Because electrical switch 124 is closed, if the electrical system 100 is functioning properly, the voltages on the buses 120, 122 via the second power converter 114 should be known, and thus the likewise the measured voltages detected by first voltmeter 108 and second voltmeter 110, respectively, may be determined to be within an expected voltage range. For example, if first voltmeter 108 and second voltmeter 110 were each reading 0 Volts when electrical switch 124 was open, they could now display a voltage potential rise up to the amount of voltage being provided by power supply 104 or converter on first bus 120 voltage and second bus 122 voltage (although due to bus impedance, the voltage rise may not reach the full voltage value being supplied by the power supply 104). First bus 120 voltage and/or second bus 122 voltage may be, for example, 12 Volts, 24 Volts, or 50 Volts. Thus, an expected voltage range may include a range of voltages near or around the amount of voltage being provided by power supply 104/second power converter 114, such as a voltage range that includes the 12 Volts (e.g., 10 Volts to 14 Volts), 24 Volts (e.g., 22 Volts to 26 Volts), or 50 Volts (e.g., 45 Volts to 55 Volts).

If the detected voltages are not within the expected voltage range, the operator should assume that the meters are not working and electrical system 100 is not electrically safe.

In some embodiments, voltage detection circuit 102 includes a processor 126 operably coupled to one or more of first voltmeter 108 and second voltmeter 110. Processor 126 may be any suitable processor, such as an image signal processors (ISP), digital signal processor (DSP), central processing unit (CPU), graphics processing unit (GPU), or any other suitable processor. Processor 126 may determine a voltage measured by one or more of first voltmeter 108 and second voltmeter 110 by receiving an indication of the voltage measured from first voltmeter 108 or second voltmeter 110. In some examples, processor 126 may provide the measured voltage for display or display an indication of the voltage. For example, processor 126 may provide the measured voltage to display 128 for display.

In some embodiments, visual indicators (not shown), such as light emitting diodes (LEDs), may indicated voltage levels. For example, one or more of first voltmeter 108 and second voltmeter 110 may be electrically connected via the processor to one or more LEDs. The LEDs may indicate, for example, if a detected voltage is below a voltage range (e.g., a yellow LED), within a voltage range (e.g., a green LED), or above the voltage range (e.g., a red LED). In some embodiments, a number of LEDs are turned on based on the detected voltage level (e.g., the higher the voltage, the more LEDs that are turned on). In some examples, the detected voltage is shown on a display (e.g., screen) (not shown) visible to the operator. Moreover, the processor may guide the technician through the process and provide an indication that the rails are safe only after the proper steps have been successfully completed.

Figure 2:
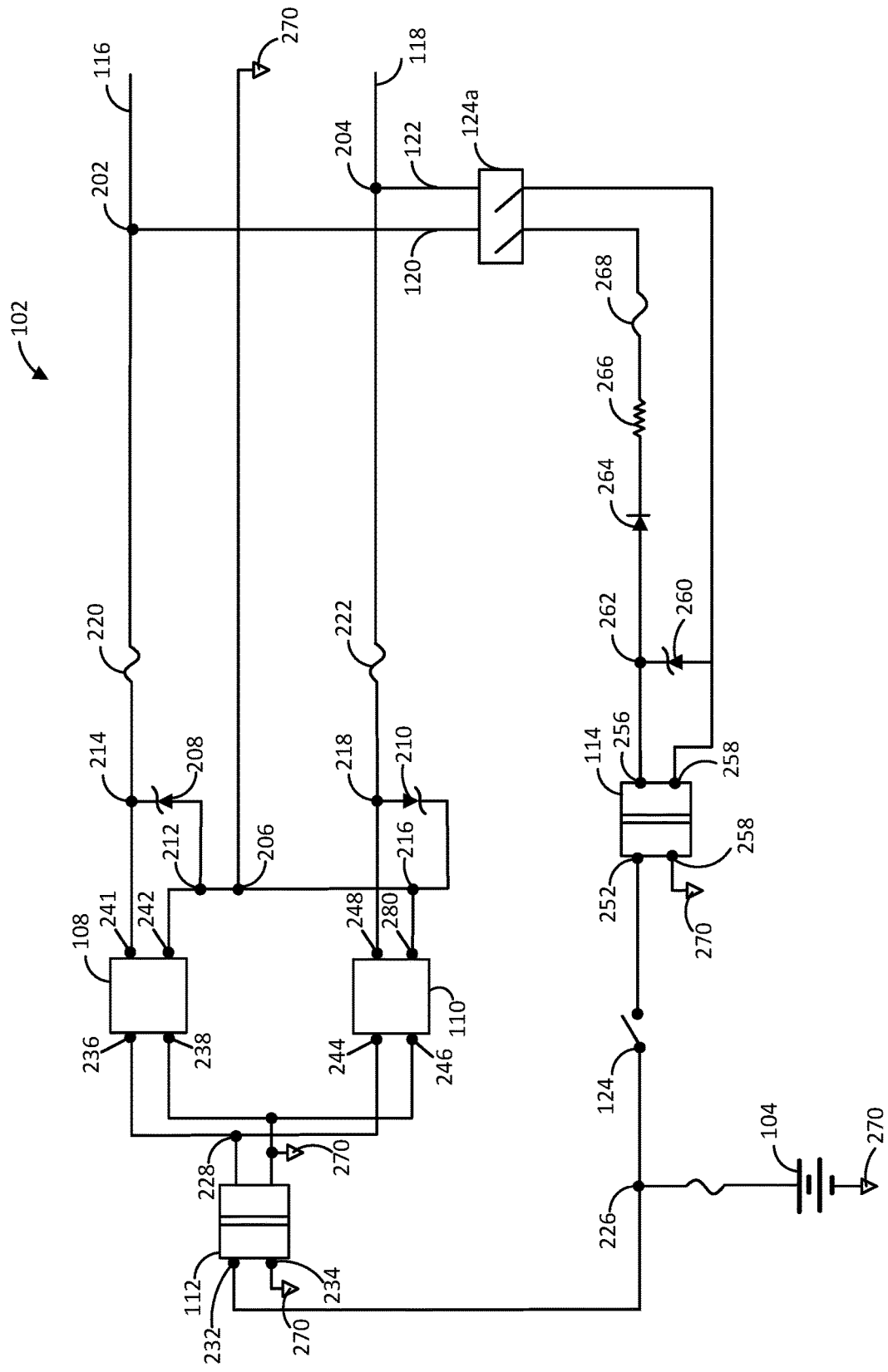
FIG. 2 is a more detailed block diagram of the voltage detection circuit of FIG. 1 in accordance with some embodiments of the present disclosure.

FIG. 2 illustrates a more detailed block diagram of the voltage detection circuit 102 of FIG. 1. In this example, power supply 104 is electrically connected between ground 270 and node 226. Node 226 is electrically connected to electrical switch 124. Electrical switch 124 controls whether power from power supply 104 is provided to second power converter 114 as discussed above with respect to FIG. 1 and in more detail further below.

Node 226 is also electrically connected to power input (e.g., power pin) 232 of first power converter 112. As such, first power converter 112 receives power (e.g., voltage) from power supply 104 via power input 232. In some embodiments, there is an optional switch (not shown) between node 226 and power input 232 of first power converter 112. The optional switch may be, for example, a mechanical or electrical switch. This optional switch allows for the control of power from power supply 104 to first power converter 112. For example, if the switch is closed, first power converter 112 receives power from power supply 104. If, however, the switch is open, then no power is provided to first power converter 112.

First power converter 112 also includes ground input (e.g., ground pin) 234, which is electrically connected to ground 270. First power converter 112 provides power (e.g., converted power, such as a low DC voltage in an example where power converter 112 is a DC to DC power converter) on power output 272 to node 228. Node 228 is electrically connected to power input 236 of first voltmeter 108 and to power input 244 of second voltmeter 110. As such, first power converter 112 may provide power to first voltmeter 108 and second voltmeter 110. Ground input 234 of first power converter 112 is electrically connected to ground 270 and to node 230. Node 230 is also electrically connected to ground input 238 of first voltmeter 108, and to ground input 244 of second voltmeter 110, thus providing a common ground connection amongst these devices.

Voltage input 241 of first voltmeter 108 is electrically connected to first voltmeter connection 116. Ground input 242 is electrically connected to node 206, which is electrically connected to ground 270. As such, when powered, first voltmeter 108 may detect a voltage on first voltmeter connection 116. Similarly, voltage input 248 of second voltmeter 110 is electrically connected to second voltmeter connection 118. Second voltmeter 110 also includes ground input 250, which is electrically connected to ground 270 via node 216. As such, when powered, second voltmeter 112 may detect a voltage on second voltmeter connection 118.

Voltage detection circuit 102 includes various electrical protection features. For example, as shown in FIG. 2, fuse 220 is electrically connected between node 214 and node 202 of first voltmeter connection 116. Similarly, fuse 222 is electrically connected between node 218 and node 204 of second voltmeter connection 118. These fuses 220, 222 will burn (e.g., blow) if the current through them exceeds their rated values for an excessive amount of time.

In addition, Zener diode 208 is electrically connected between node 212, which is electrically connected to ground 270, and node 214. Specifically, the cathode of Zener diode 208 is electrically connected to node 215, and the anode of Zener diode 208 is electrically connected to node 212. As such, a voltage on first voltmeter connection 116 that exceeds Zener diode's 208 critical reverse voltage will cause current to flow from first voltmeter connection 116, across Zener diode 208, to ground 270. In this manner, in overvoltage conditions, Zener diode 208 allows current to flow from first voltmeter connection 116 to ground 270, allowing fuse 220 to blow and thereby protecting, for example, first voltmeter 108 from excessive voltage.

Similar protection is provided for second voltmeter 110. Specifically, Zener diode 210 is electrically connected between node 218, which is electrically connected to second voltmeter connection 118, and node 216, which is electrically connected to ground 270. Zener diode 210 is positioned such that its cathode is electrically connected to node 216, and its anode is electrically connected to node 218. As such, a negative voltage on second voltmeter connection 118 that exceeds Zener diode's 210 critical reverse voltage will cause current to flow from ground 270, across Zener diode 210, to second voltmeter connection 118. Thus, in overvoltage conditions, Zener diode 210 allows current to flow from ground to second voltmeter connection 118, allowing fuse 222 to blow thereby protecting second voltmeter 110.

As noted above, if electrical switch 124 is closed, power from power supply 104 is provided to second power converter 114, thereby allowing second power converter 114 to power first voltmeter connection 116 and second voltmeter connection 118. Specifically, closing electrical switch 124 allows power to be received from power supply 104 on power input 252 of second power converter 114. Second power converter 114 also includes ground input 254 which is electrically connected to ground 270. Second power converter 114 converts the incoming power from the power supply 104 to output power on power output 256 and power output 258. Power output 256 is electrically connected to first voltmeter connection 116, and power output 28 is electrically connected to second voltmeter connection 118. As such, when electrical switch 124 is closed, second power converter 114 may provide voltages on first voltmeter connection 116 and second voltmeter connection 118, which may then be detected by first voltmeter 108 and second voltmeter 110, respectively.

Resistor 266 limits the current provided by the second power converter 114 to prevent over-current conditions. In addition, diode 264, which may be rated for a particular charging current and blocking bus voltage is electrically connected between the power output 256 and resistor 266 to protect the second power converter 114 from any high voltage experienced on first voltmeter connection 116.

In addition, Zener diode 260 and fuse 268 may be employed. In this example, fuse 268 is electrically connected between resistor 266 and node 202. Fuse 268 will burn if the current through it exceeds its rated value. In an attempt to prevent damage to second power converter 114 from excessive voltage before fuse 268 blows, Zener diode 260 diverts excessive current from first voltmeter connection 116 to second voltmeter connection 118 when a voltage on first voltmeter connection 116 exceeds its critical reverse voltage.

Specifically, the anode of Zener diode 260 is electrically connected to second voltmeter connection 118, and the cathode of Zener diode 260 is electrically connected to first voltmeter connection 116. A voltage across Zener diode 260 that exceeds its reverse critical voltage will cause current to flow from first voltmeter connection 116, across Zener diode 260, to second voltmeter connection 118.

Figure 3:
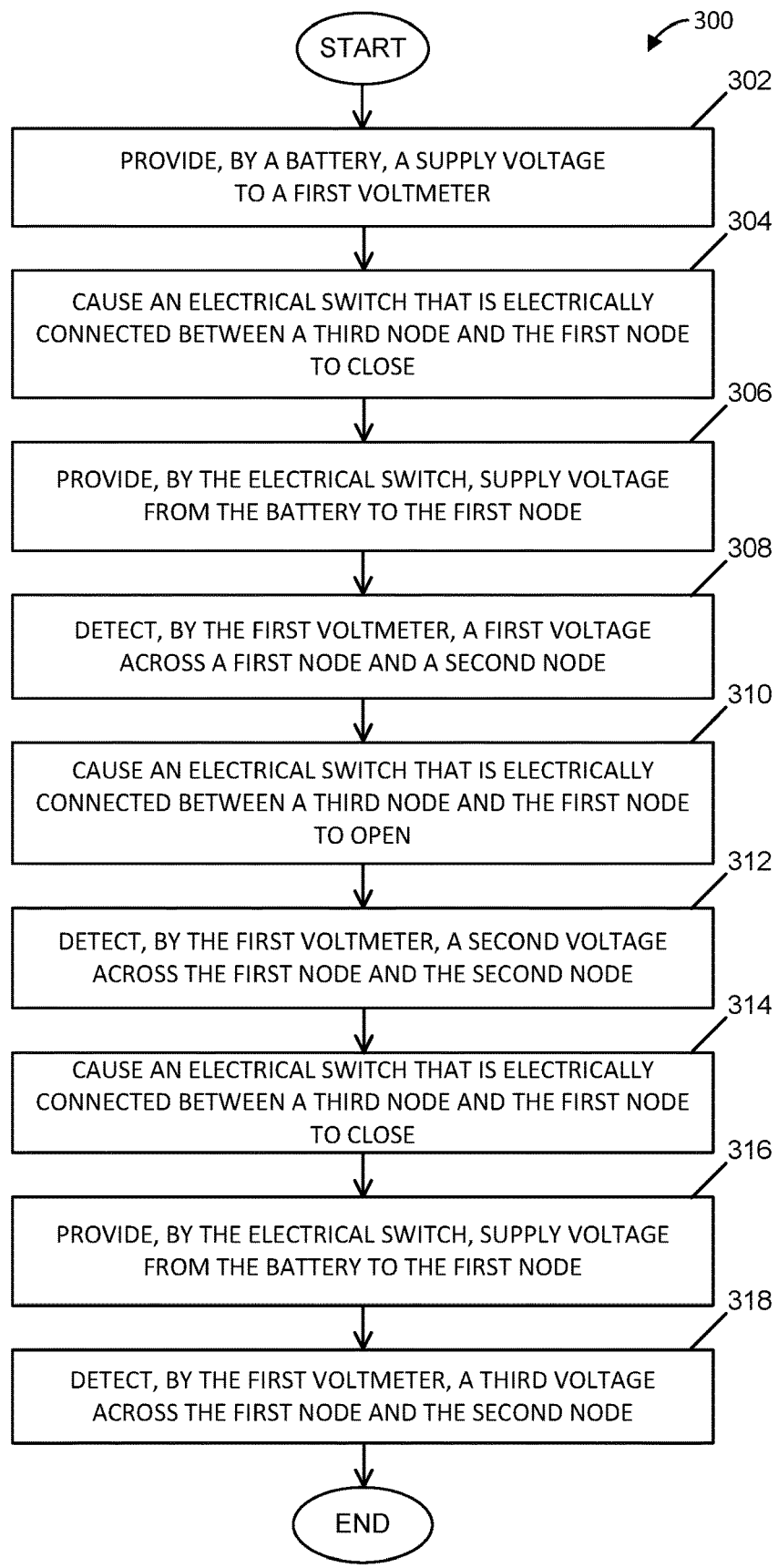
FIG. 3 is a flowchart of an example method in accordance with some embodiments of the present disclosure.

FIG. 3 is a flow chart of an exemplary method 300 that may be carried out by, for example, electrical system 100. The method illustrated in FIG. 3, and each of the example methods described herein, may be carried out by electrical system 100. Although the methods are described with reference to the illustrated flowcharts, it will be appreciated that many other ways of performing the acts associated with the methods may be used. For example, the order of some operations may be changed, and some of the operations described may be optional.

In practice, prior to performing the live dead live testing, the operational power supply 103 is disconnected from the bus(es). An embodiment of the disclosed Live-dead-live method 300 begins at block 302, where a battery provides a supply voltage to a first voltmeter. At block 304, an electrical switch electrically connected between the battery and a first node is activated (e.g., closed) by a user or a processor. At step 306, the electrical switch provides supply voltage from the battery, or other known low voltage source, across the first node and a second node (e.g., ground). At block 308, the first voltmeter detects a first voltage across the first node and the second node. The detected voltage may be compared to an expected voltage by the user or automatically by a processor. If the detected voltage is within an expected range, the test may continue. Otherwise, a fault in the detection circuit 102, or a fault in the disconnect from the operational power supply is noted and the test terminates. The first node may be electrically connected to a first power bus, and the second node may be electrically connected to ground. For example, the first node may be node 202 of FIG. 2, and the second node may be node 206 of FIG. 2.

At block 310, the electrical switch is opened thereby removing the battery voltage from across the first node and the second node. At block 312, the first voltmeter detects the voltage between the first and second node to determine a second voltage across the first node and the second node. The detected voltage may be measured, by a user or a processor, to determine if it's within a safe operating range (e.g. at a non-harmful or zero voltage). If the measured voltage is within the safe operating range, the test continues as shown in block 314 where the electrical switch is closed. At block 316, the electrical switch once again provides the battery voltage across the first node and the second node. At block 318, the first voltmeter detects a third voltage across the first node and the second node to ensure it is within the expected range. This last step ensures that there was no fault in the voltage detection circuit prior to the measurement performed in block 308.

On the successful completion of the Live-dead-live method, the user is assured the buses or rails are absence of dangerous voltage hazards and may be accessed by the technician. The ultimate decision regarding the absence of voltage may be made by the user performing the method, or may be made by the processor, which may indicate to the technician by an LED or other indicia that the rails are not a voltage hazard.

Figure 4:
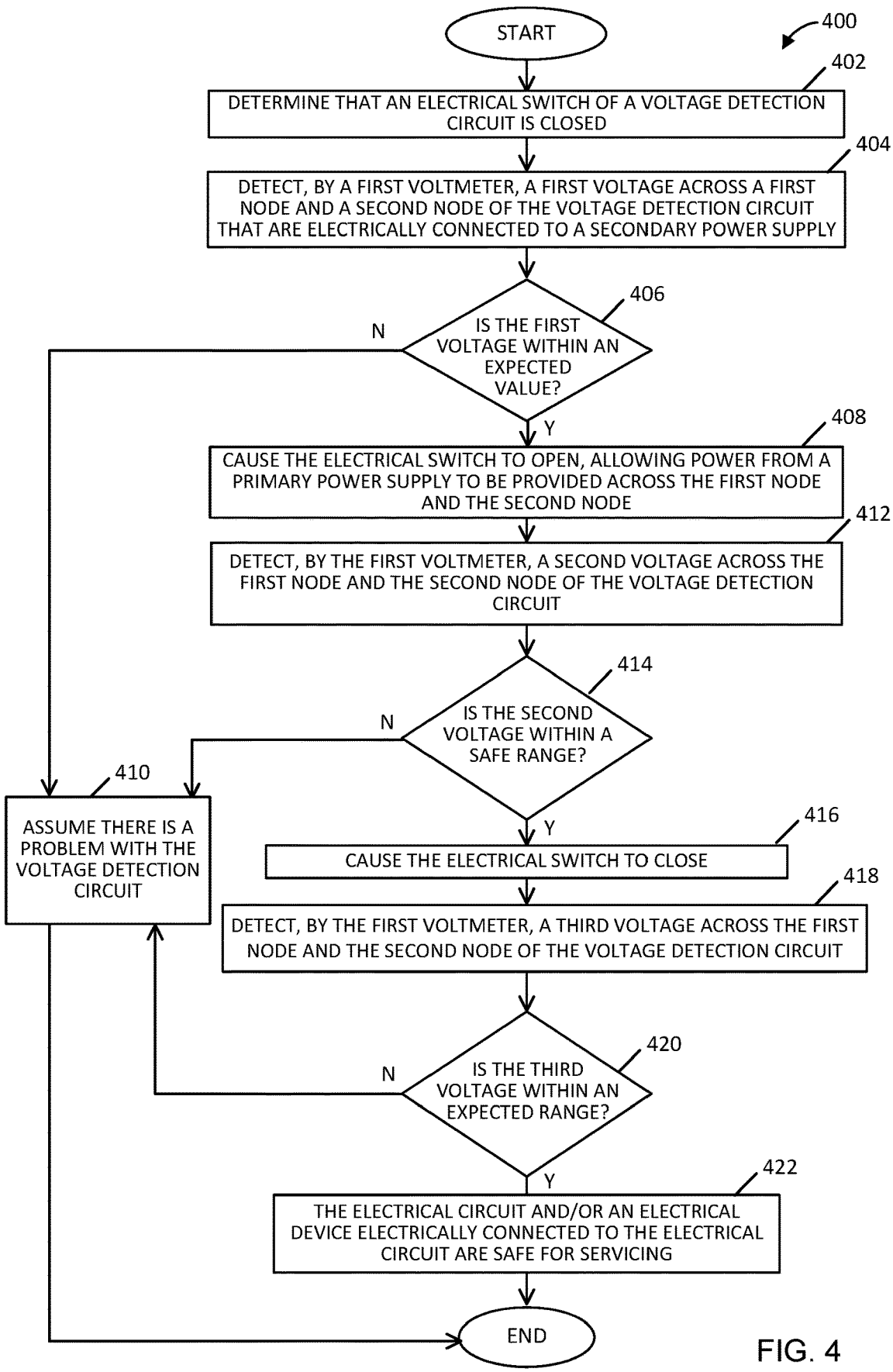
FIG. 4 is a flowchart of another example method in accordance with some embodiments of the present disclosure.

FIG. 4 is a flow chart of another exemplary method 400 that may be carried out by, for example, electrical system 100. At block 402, a determination is made that an electrical switch of a voltage detection circuit is closed. At block 404, a first voltage meter detects a first voltage across a first node and a second node that are electrically connected to a secondary power supply of the voltage detection circuit, which provides the voltage across the first node and the second node. At block 406, a determination is made as to whether the first voltage is within an expected voltage range. The expected voltage range may be a range of voltages based on the voltage the secondary power supply is providing across the first node and the second node. If the first voltage is not within the expected voltage range, the method proceeds to block 410. At step 410, an assumption is made that there is a problem with the voltage detection circuit. For example, an operator testing the electrical load would assume that the electrical load is in an electrically unsafe condition. The method then ends.

Otherwise, if, at block 406, the first voltage is within a safe voltage range, the method proceeds to block 408. At block 408, the electrical switch is opened, allowing power from a primary power supply to be provided across the first node and the second node. The method then proceeds to block 412, where the first voltage meter detects a second voltage across the first node and the second node of the voltage detection circuit. At block 414, a determination is made as to whether the second voltage is within a safe voltage range (e.g., a non-hazardous range). If the second voltage is not within the safe voltage range, the method proceeds to block 410. Otherwise, the method proceeds to block 416.

At block 416, the electrical switch is closed. At block 418, the first voltage meter detects a third voltage across the first node and the second node of the voltage detection circuit. Proceeding to step 420, a determination is made as to whether the third voltage is within the expected voltage range. The expected voltage range may be the same as the expected voltage range used in block 406. If the third voltage is not within the expected voltage range, the method proceeds to block 410. Otherwise, the method proceeds to block 422, where the electrical circuit and/or an electrical device connected to the electrical circuit (e.g., electrical load of FIG. 1) are safe for servicing. The method then ends.

Figure 5:
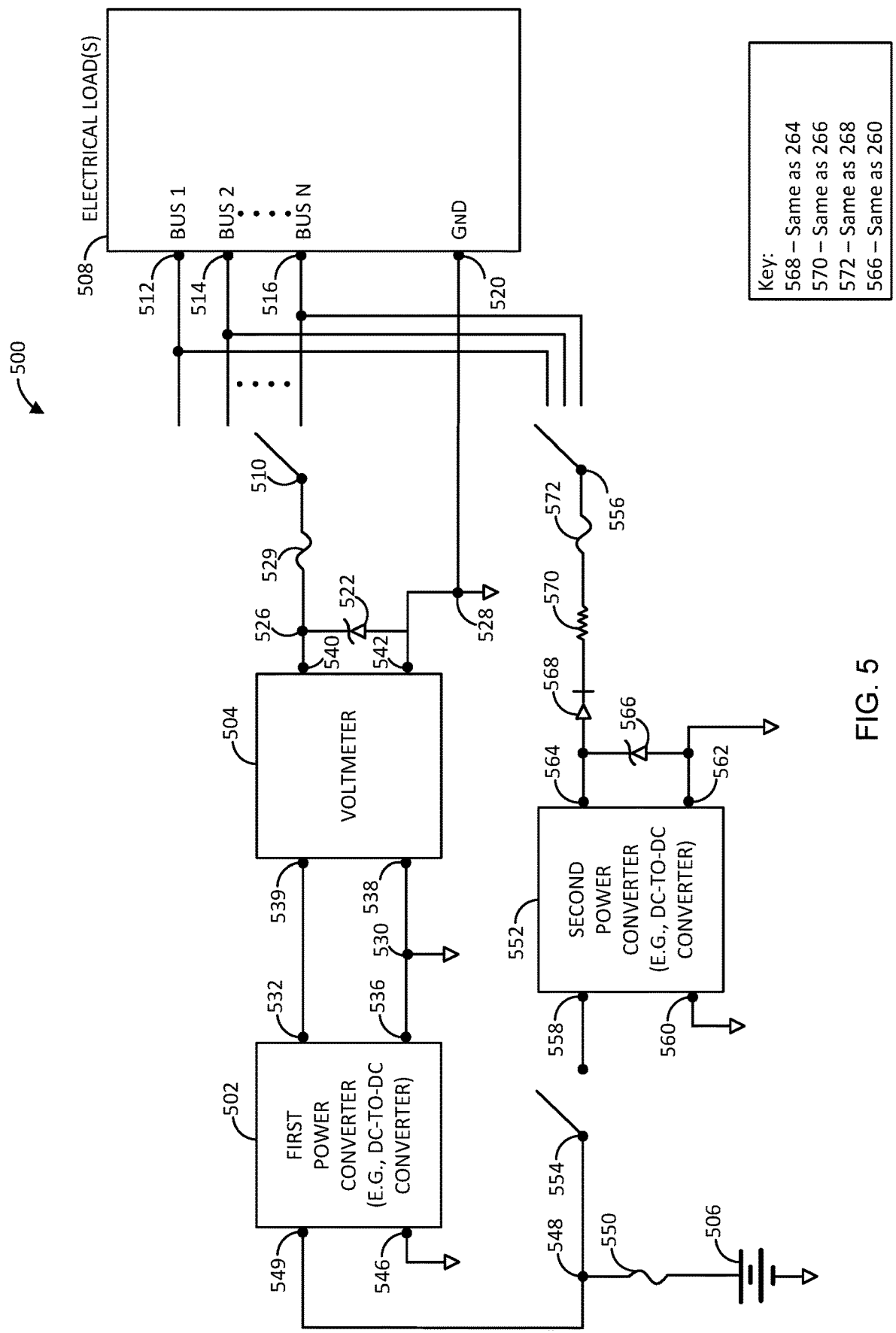
FIG. 5 is a block diagram of another exemplary electrical system that includes a switchable voltage detection circuit with an isolated power supply in accordance with some embodiments of the present disclosure.

FIG. 5 illustrates a block diagram of an exemplary electrical system 500 that includes power supply 506, a first power converter 502, a second power converter 552, voltmeter 504, and electrical load 508. In this example, power supply 506 provides power to the power input (e.g., power pin) 544 of power converter 502. Fuse 550 may be electrically connected between node 548 and power supply 506 to guard against overcurrent conditions. In some examples, an optional switch is provided between node 548 and power input 544. The optional switch allows for the control of power from power supply 506 to power converter 502.

Power converter 502 may be any suitable power convertible, such as a DC to DC power converter. Power converter 502 provides power on power output 532, and also includes ground inputs (e.g., ground pins) 546, 536 that are electrically connected to ground at node 530. In this example, power output 532 is electrically connected to the power input 534 of voltmeter 504.

Voltmeter 504 may detect a voltage across voltage inputs 540, 542. In this example, voltage input 540 is electrically connected to switch 510 across fuse 524, and voltage input 542 is electrically connected to ground via node 528. In addition, Zener diode 522 is electrically connected between node 526, which is electrically connected to voltage input 540, and node 528 which is connected to ground.

Switch 510 may be any suitable switch, such as an electrical or mechanical switch. Switch 510 is operable to switch between various busses of electrical load 508. In this example, switch 510 is operable to switch between first bus 512, second bus 514, and up to bus N 516 of electrical load 508. As indicated in the diagram, any number of busses is contemplated. Each of the busses 512, 514, 516 may be power busses, power rails, or any other electrical bus of electrical load 508. Electrical load 508 also includes a ground input 520.

Based on the position of switch 510, voltmeter 504 may detect a voltage across any of busses 512, 514, 516 and ground. For example, to detect voltage across first bus 512 and ground, switch 510 is adjusted to select first bus 512 of electrical load 508. Similarly, to detect voltage across second bus 514 and ground, switch 510 is adjusted to select second bus 514 of electrical load 508. To detect voltage across bus N 516 and ground, switch 510 is adjusted to select bus N 516 of electrical load 508. In this manner, voltmeter 504 may detect voltages on any number of busses of electrical load 508.

Electrical system 500 also includes switch 554, second power converter 552, and switch 556. Switch 554 may be any suitable switch, such as a mechanical or electrical switch. Second power converter 552 may be any suitable power converter, such as a DC to DC power converter. Second power converter 552 includes power input 558, ground inputs 560, 562, and a power (e.g., voltage) output 564. When switch 554 is open, second power converter 552 is not powered. When switch 554 is closed, power supply 506 may supply power to power input 558 of second power converter 552, thereby providing converted power on power output 564.

Electrical system 500 further includes Zener diode 566 electrically connected across power output 564 and ground. Electrical system 500 also includes diode 568, resistor 570, and fuse 572 electrically connected between power output 564 and switch 556.

Switch 556 is electrically connected to power output 564 of second power converter 552, and may switch between any busses 512, 514, 516 of electrical load 508. For example, to provide a voltage across first bus 512 and ground, switch 556 is adjusted to select first bus 512 of electrical load 508. Similarly, to provide a voltage across second bus 514 and ground, switch 556 is adjusted to select second bus 514 of electrical load 508. To provide a voltage across bus N 516 and ground, switch 556 is adjusted to select bus N 516 of electrical load 508.

As such, when switch 554 is closed thereby powering second power converter 552, second power converter 552 may provide power to any one of the busses 512, 514, 516 of electrical load 508 for detection by voltmeter 504. For example, with switch 554 closed, switch 556 and switch 510 may be adjusted to each select first bus 512 of electrical load 508. Thus, power provided by second power converter 552 via switch 556 to first bus 512 of electrical load 508 may be detected, via switch 510, by voltmeter 504.

Similarly, with switch 554 closed, switch 556 and switch 510 may be adjusted to each select second bus 514 of electrical load 508. Thus, power provided by second power converter 552 via switch 556 to second bus 514 of electrical load 508 may be detected, via switch 510, by voltmeter 504. Likewise, with switch 554 closed, switch 556 and switch 510 may be adjusted to each select bus N 516 of electrical load 508. Thus, power provided by second power converter 552 via switch 556 to bus N 516 of electrical load 508 may be detected, via switch 510, by voltmeter 504.

In some examples, switches 510, 554, and 556 are mechanically or electrically coupled (e.g., connected). For example, if switch 554 is closed, then switches 510 and 556 are coupled together such that they select the same bus 512, 514, 516. If switch 554 is open, then switch 510 may select any bus 512, 514, 516.

In some applications, when a bus is ready to be checked for absence of voltage, the panel (e.g., voltage) meters should be on and reading zero volts. If the panel meters are not on, the operator must ensure the power to the isolated power supply, which supply power to the panel meters, is on. If the power is on and the panel meters are not functioning, the operator may need to proceed with the standard Live-Dead-Live check.

With both meters on and reading zero volts, the operator simply presses the momentary pushbutton located on the exterior of the equipment. The panel meters should both show voltage potential rise on the bus, though it may not be the full value of the regulated supply (this may occur if the effective impedance of the 700 V bus is low). Upon release of the pushbutton, the operator should witness both panel meters' displays reduce to zero volts again. It is at this point the operator can be assured that there is no hazardous electric potential present on the bus being measured. However, if there are contactors or multiple busses contained in a panel, it should not be assumed the equipment is safe to work with.

Although examples are illustrated and described herein, embodiments are nevertheless not limited to the details shown, since various modifications and structural changes may be made therein by those of ordinary skill within the scope and range of equivalents of the claims.

What is claimed is:

1. A high voltage power rail with an integral voltage hazard safety circuit, comprising:
   an electric rail comprising a first node and a second node, wherein the electric rail is electrically connected to a high voltage operational power supply;
   an electrically driven device connected to the high voltage operational power supply via the electric rail;
   a voltage meter having a first probe attached to the first node of the electric rail and a second probe attached to the second node of the electric rail;
   a secondary power supply configured to provide a known voltage across the first and second nodes of the electric rail, wherein the second power supply is electrically connected to and powers the voltage meter, and wherein the high voltage operational power supply and the secondary power supply are independent of each other;
   a first switch positioned electrically between the electric rail and the high voltage operationally power supply, and operable to electrically connect and disconnect the high voltage operational power supply to the electric rail;
   a second switch positioned electrically between the electric rail and the secondary power supply, and operable to electrically connect and disconnect the secondary power supply to the electric rail; and
   a voltage indicator operably connected to the voltage meter and configured to provide an indication of a voltage measured by the voltage meter.

2. The high voltage power rail with an integral voltage hazard safety circuit of claim 1, further comprising a second voltage meter having a first probe attached to a first node of a second electric rail and a second probe attached to a second node of the second electric rail, wherein the voltage indicator is operably connected to the second voltage meter and configured to provide an indication of a voltage measured by the second voltage meter.

3. The high voltage power rail with an integral voltage hazard safety circuit of claim 1, further comprising an isolation circuit that protects the secondary power supply from voltage on the electric rail provided by the high voltage operational power supply comprising:
   a first diode positioned electrically between the first node and the second node and operable to allow current to flow from the first node to the second node when a first threshold of voltage across the first diode is reached.

4. The high voltage power rail with an integral voltage hazard safety circuit of claim 3 wherein the isolation circuit further comprises:
   a second diode positioned electrically between the secondary power supply and the first node;
   a resistor positioned electrically between the secondary power supply and the first node; and
   a fuse positioned electrically between the secondary power supply and the first node.

5. The high voltage power rail with an integral voltage hazard safety circuit of claim 1 further comprising a removable housing that prevents access to the electric rail while in an installed state.

6. The high voltage power rail with an integral voltage hazard safety circuit of claim 5 wherein the voltage indicator is observable when the removable housing is in the installed state.

7. The high voltage power rail with an integral voltage hazard safety circuit of claim 1 wherein a voltage of the high voltage operational power supply is greater than a maximum voltage of the secondary power supply.

8. The high voltage power rail with an integral voltage hazard safety circuit of claim 1 wherein the second switch is a momentary contact switch that is biased open.

9. The high voltage power rail with an integral voltage hazard safety circuit of claim 1 wherein the voltage indicator comprises a processor that is operably coupled to the voltage meter and configured to determine the voltage measured by the voltage meter.

10. The high voltage power rail with an integral voltage hazard safety circuit of claim 9 wherein the processor is operably coupled to a display and configured to provide the indication of the voltage measured by the voltage meter to the display.

11. The high voltage power rail with an integral voltage hazard safety circuit of claim 9 wherein the processor is operably coupled to the second switch and configured to determine whether the second switch is open or closed, wherein the processor is further configured to determine whether the voltage measured by the voltage meter is within a safe voltage range based on whether the second switch is open or closed.

12. The high voltage power rail with an integral voltage hazard safety circuit of claim 11 wherein the processor is configured to determine whether the voltage measured by the voltage meter is within the safe voltage range based on the known voltage provided by the secondary power supply when the second switch is closed.

13. The high voltage power rail with an integral voltage hazard safety circuit of claim 1 further comprising an isolation circuit comprising a diode positioned electrically between the first node and the second node, and a fuse positioned electrically between the first node and the diode.

14. The high voltage power rail with an integral voltage hazard safety circuit of claim 1 further comprising a direct current (DC)-to-DC power converter positioned electrically between the second switch and the first node.

15. The high voltage power rail with an integral voltage hazard safety circuit of claim 1 further comprising a third switch positioned electrically between the secondary power supply and the voltage meter, and operable to electrically connect and disconnect the secondary power supply to the voltage meter.

16. A method of detecting a voltage hazard comprising:
providing, by a secondary power supply, operational power to a voltage meter having a first probe attached to a first node of an electric rail and a second probe attached to a second node of the electric rail;
providing, by the secondary power supply, a known voltage across the first and second nodes of the electric rail when a first switch is closed;
closing the first switch;
detecting, by the voltage meter, a first voltage of the electric rail;
providing, by a voltage indicator operably connected to the voltage meter, an indication of the first voltage;
determining, based on the indication of the first voltage, whether the first voltage is within an expected range;
opening the first switch;
detecting, by the voltage meter, a second voltage of the electric rail when the first switch is open;
providing, by the voltage indicator, an indication of the second voltage;
determining, based on the indication of the second voltage, whether the second voltage is within a safe range;
closing the first switch;
detecting, by the voltage meter, a third voltage of the electric rail when the first switch is closed;
providing, by the voltage indicator, an indication of the third voltage; and
determining, based on the indication of the third voltage, whether the third voltage is within the expected range.

17. The method of claim 16 further comprising:
providing, by the secondary power supply, operational power to a second voltage meter having a first probe attached to a first node of a second electric rail and a second probe attached to a second node of the second electric rail;
providing, by the secondary power supply, a known voltage across the first and second nodes of the second electric rail when the first switch is closed;
detecting, by the second voltage meter, a first voltage of the second electric rail;
providing, by the voltage indicator operably connected to the second voltage meter, an indication of the first voltage of the second electric rail;
determining, based on the indication of the first voltage of the second electric rail, whether the first voltage of the second electric rail is within a second expected range;
detecting, by the second voltage meter, a second voltage of the second electric rail when the first switch is open;
providing, by the voltage indicator, an indication of the second voltage of the second electric rail;
determining, based on the indication of the second voltage of the second electric rail, whether the second voltage of the second electric rail is within a second safe range;
detecting, by the second voltage meter, a third voltage of the second electric rail when the first switch is closed;
providing, by the second voltage indicator, an indication of the third voltage of the second electric rail; and
determining, based on the indication of the third voltage of the second electric rail, whether the third voltage is within the second expected range.

18. The method of claim 16 further comprising:
providing, by a high voltage operational power supply, a high voltage to an electrically driven device connected to the electric rail, wherein the secondary power supply is independent of the high voltage operational power supply; and
detecting, by the voltage meter, a hazardous voltage across the first and second nodes of the electric rail based on providing the high voltage to the electrically driven device.

* * * * *